(12) United States Patent
Dames et al.

(10) Patent No.: US 10,132,839 B2
(45) Date of Patent: Nov. 20, 2018

(54) ELECTRICITY METER AND AN INSULATING CARRIER FOR A SENSOR COMPONENT OF AN ELECTRICITY METER

(71) Applicant: Sentec Ltd., Cambridge (GB)

(72) Inventors: Andrew Dames, Cambridge (GB); Robert Davidson, Cambridge (GB); Edward Colby, Cambridge (GB)

(73) Assignee: SENTEC LTD, Cambridge (GB)

( * ) Notice: Subject to any disclaimer, the term of this patent is extended or adjusted under 35 U.S.C. 154(b) by 228 days.

(21) Appl. No.: 14/891,634

(22) PCT Filed: May 15, 2014

(86) PCT No.: PCT/GB2014/051495
§ 371 (c)(1),
(2) Date: Nov. 16, 2015

(87) PCT Pub. No.: WO2014/184565
PCT Pub. Date: Nov. 20, 2014

(65) Prior Publication Data
US 2016/0084886 A1    Mar. 24, 2016

(30) Foreign Application Priority Data

May 16, 2013    (GB) .................................. 1308868.7

(51) Int. Cl.
*G01R 15/14*    (2006.01)
*G01R 22/06*    (2006.01)
(Continued)

(52) U.S. Cl.
CPC ........... *G01R 15/14* (2013.01); *G01R 15/207* (2013.01); *G01R 22/065* (2013.01); *G01R 1/203* (2013.01); *G01R 19/0092* (2013.01); *G01R 21/06* (2013.01)

(58) Field of Classification Search
CPC ............... G01R 19/0092; G01R 1/203; G01R 19/0084; G01R 35/005; G01R 21/06
(Continued)

(56) References Cited

U.S. PATENT DOCUMENTS 5,552,700 A * 9/1996 Tanabe ................. G01R 15/202
324/117 H
5,917,401 A * 6/1999 Smith .................... G01R 1/203
29/610.1
(Continued)

FOREIGN PATENT DOCUMENTS

EP    2060923    5/2009
EP    2196811    11/2009
(Continued)

OTHER PUBLICATIONS

International Search Report and Written Opinion for PCT/GB2014/051495, dated Jul. 31, 2014 (12 pages).
(Continued)

*Primary Examiner* — Christopher McAndrew
(74) *Attorney, Agent, or Firm* — Patent Law Works LLP (57) ABSTRACT

An electricity meter comprises a conductor having a substantially planar surface; and a carrier for carrying a sensor component for enabling detection of current flowing in the conductor, wherein the carrier is spaced from the planar surface of the conductor by an arrangement of at least three spacing elements. The spacing elements may project from the carrier or from the substantially planar surface of the conductor.

22 Claims, 8 Drawing Sheets

(51) Int. Cl.
*G01R 15/20* (2006.01)
*G01R 1/20* (2006.01)
*G01R 19/00* (2006.01)
*G01R 21/06* (2006.01)

(58) Field of Classification Search
USPC ........................................................ 324/126
See application file for complete search history.

(56) References Cited

U.S. PATENT DOCUMENTS

| | | | |
|---|---|---|---|
| 6,414,475 B1 * | 7/2002 | Dames | G01R 15/18 324/127 |
| 6,528,960 B1 * | 3/2003 | Roden | G01R 19/0092 318/400.32 |
| 6,791,315 B2 * | 9/2004 | Skerritt | G01R 19/32 324/126 |
| 2004/0263150 A1 | 12/2004 | Hetzler | |
| 2005/0134254 A1 * | 6/2005 | Roden | G01R 1/203 324/126 |

FOREIGN PATENT DOCUMENTS

| | | |
|---|---|---|
| JP | 2001066327 | 3/2001 |
| JP | 2005195446 | 7/2005 |
| JP | 2011080973 | 4/2011 |
| KR | 1020110109226 | 10/2011 |
| WO | WO 01/11376 | 2/2001 |

OTHER PUBLICATIONS

Notification Concerning Transmittal of International Preliminary Report on Patentability for PCT/GB2014/051495, dated Nov. 26, 2015 (9 pages).

* cited by examiner

ELECTRICITY METER AND AN INSULATING CARRIER FOR A SENSOR COMPONENT OF AN ELECTRICITY METER

CROSS REFERENCE TO RELATED APPLICATIONS

This application is a National Stage of International Application No. PCT/GB2014/051495 filed May 15, 2014, entitled "An Electricity Meter and an Insulating Carrier for a Sensor Component of an Electricity Meter", which is hereby incorporated by reference in its entirety.

FIELD

The invention relates to an electricity meter and to a carrier for a sensor component of an electricity meter.

BACKGROUND

Many different types of electricity meters are known in the art. One type, which is particularly suitable for use in monitoring electricity usage in residential premises in the United States of America and Canada, is the subject of published PCT patent application WO01/11376 A1. In such electricity meters, a main conductor is typically permanently affixed (for example by soldering) to a sensor component for enabling the current flowing in the conductor to be measured. However, this type of permanent connection may not always be desirable.

SUMMARY

In a first aspect, this specification describes an electricity meter comprising: a conductor having a substantially planar surface; and a carrier for carrying a sensor component for enabling detection of current flowing in the conductor, wherein the carrier is spaced from the planar surface of the conductor by an arrangement of at least three spacing elements. The spacing elements may project from the carrier or from the substantially planar surface of the conductor.

The sensor component may comprise a conductive track provided on a printed circuit board. Alternatively, the carrier may comprise a printed circuit board having the sensor component provided thereon.

The conductor may comprise a circulation part for causing the current flowing therein to travel a substantially circular path, and the carrier may be positioned adjacent the circulation part of the conductor. The circulation part may comprise an elongate aperture extending from a central region of the circulation part to an edge of the circulation part. The carrier may comprise a projecting arrangement configured to engage the elongate aperture thereby to restrict the movement of the carrier relative to the conductor. The circulation part may comprise a hole in an inner region thereof, the projecting arrangement being configured also to engage the hole. The elongate aperture may extend from the hole to the edge of the circulation part and the at least one projecting arrangement may comprise a first part having a shape corresponding to that of the hole and a second part having a shape corresponding to that of the elongate aperture. The carrier may include at least one projecting element projecting in an opposite direction to the at least one projecting arrangement, the at least one projecting element may be configured to engage at least one aperture formed in the sensor component.

In a second aspect, this specification describes an insulating carrier for carrying a sensor component of an electricity meter, the sensor component being configured to enable detection of current flowing in a conductor of the electricity meter, the carrier comprising: a projecting arrangement configured to engage an elongate aperture formed in a circulation part of the conductor. The projecting arrangement may be configured also to engage a hole formed in the circulation part of the conductor. The projecting arrangement may comprise a first part having a shape corresponding to that of the hole and a second part having a shape corresponding to that of the elongate aperture. The insulating carrier may include at least one projecting element projecting in an opposite direction to the projecting arrangement, and the at least one projecting element may be configured to engage at least one aperture formed in the sensor component.

In a third aspect, this specification describes a method of manufacturing an electricity meter, comprising: providing a conductor having a substantially planar surface; providing a carrier for carrying a sensor component for enabling detection of current flowing in the conductor; and providing an arrangement of at least three spacing elements to space the carrier from the planar surface of the conductor.

In a fourth aspect, this specification describes a method of manufacturing an insulating carrier for carrying a sensor component of an electricity meter, the sensor component being configured to enable detection of current flowing in a conductor of the electricity meter, the method comprising: forming a projecting arrangement extending from the carrier and configured to engage an elongate aperture formed in a circulation part of the conductor.

In a fifth aspect, this specification describes a component of an electricity meter comprising: a conductor having a substantially planar surface; and a carrier for carrying a sensor component for enabling detection of current flowing in the conductor, wherein the carrier is spaced from the planar surface of the conductor by an arrangement of at least three spacing elements. The spacing elements may project from the carrier or from the substantially planar surface of the conductor.

BRIEF DESCRIPTION OF THE FIGURES

Embodiments of the invention will now be described, by way of example, with reference to the accompanying drawings, in which.

DETAILED DESCRIPTION OF THE EMBODIMENTS

In the above-mentioned drawings and below-described embodiments, like reference numerals refer to like elements throughout.

Figure 1:
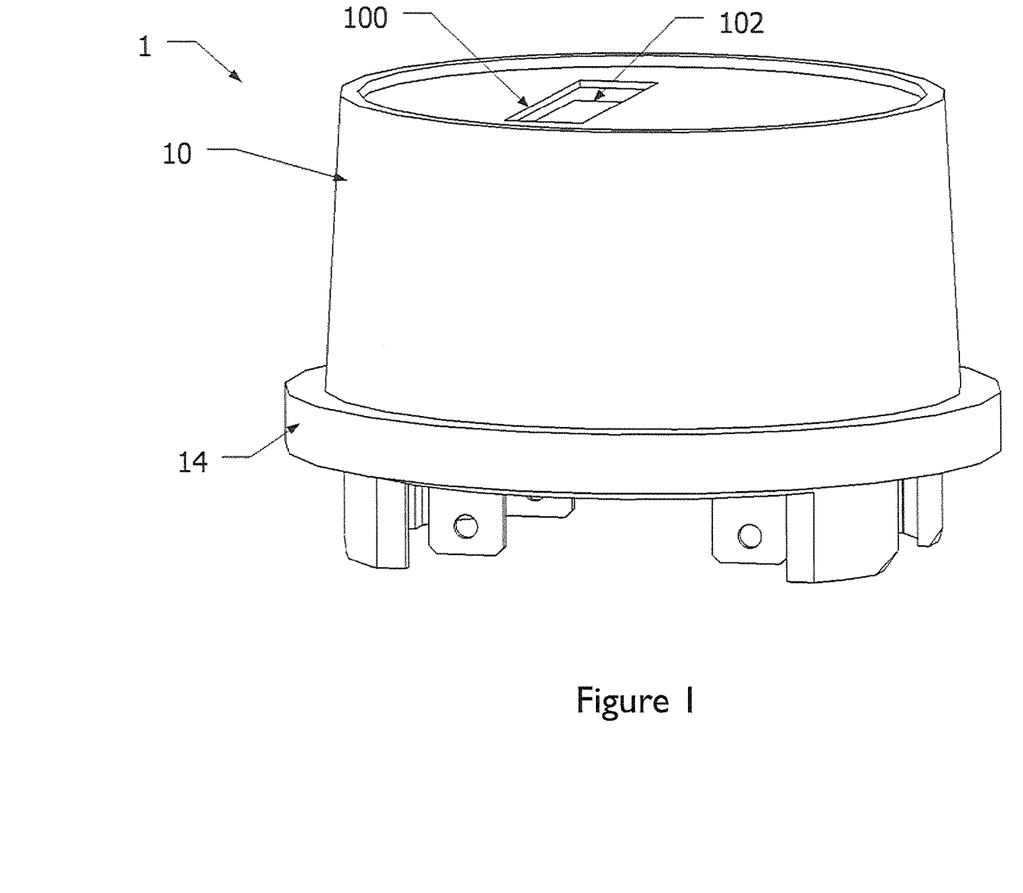
FIG. 1 is a simplified schematic view of the exterior of an electricity meter in accordance with various embodiments of the invention.

FIG. 1 is a simplified schematic view of the exterior of an electricity meter 1 in accordance with various embodiments of the invention. Visible from the exterior of the electricity meter 1 are an upper housing 10 and a meter base 14. Typically, the upper housing 10 and the meter base 14 are formed from a moulded plastic. The upper housing 10 is shaped so as to form a cavity in which various electrical components (not shown) of the meter 1 are located. The upper housing 10 is securable to the meter base 14. In this example, a twist locking mechanism is used. The upper housing 10 includes an aperture 100 through which a display 102, such as an LCD, is visible.

Figure 2:
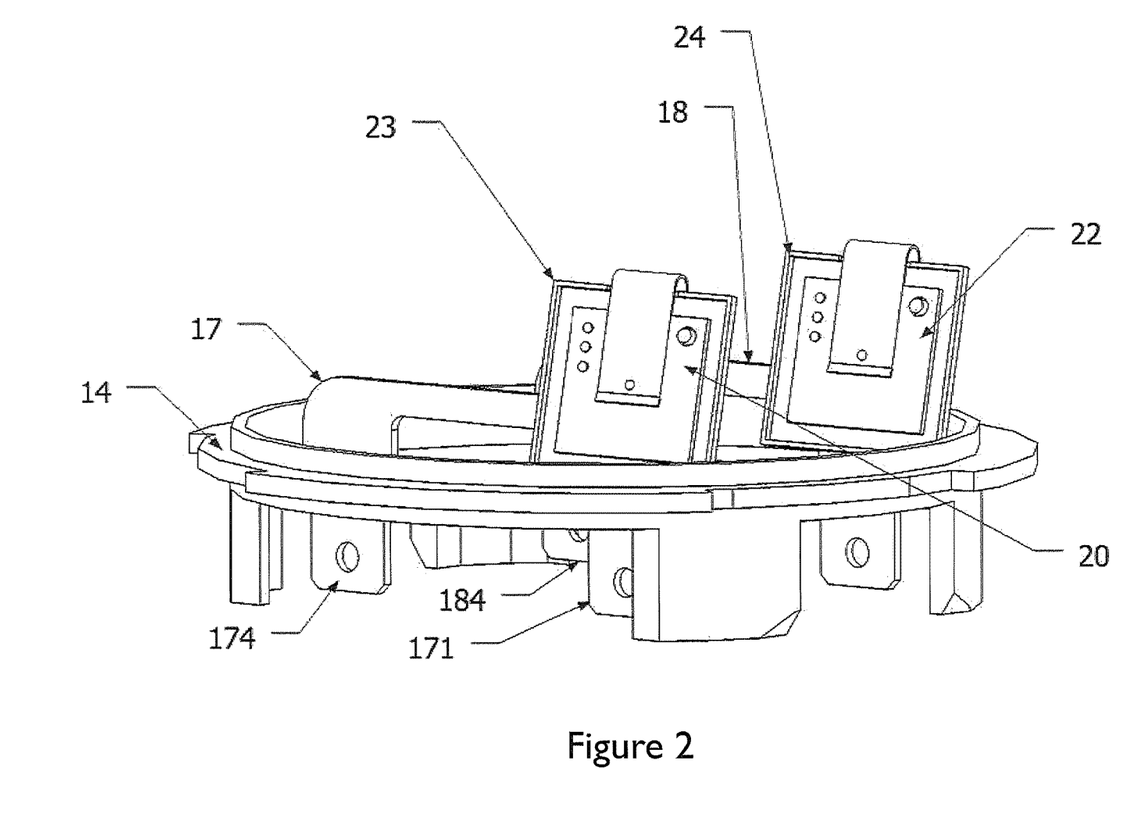
FIG. 2 is a view of the interior of the electricity meter of FIG. 1.

FIG. 2 is a view of some of the inner components of the electricity meter 1. More specifically, FIG. 2 shows first and second conductors 17, 18 and first and second sensor components 20, 22. The first and second sensor components 20, 22 are affixed to the first and second conductors by first and second connection arrangements 23, 24 respectively.

When the electricity meter 1 is in situ, the first and second conductor elements 17, 18 are connected in series with a mains electricity supply. As such, mains current from the electricity supply flows through the first and second conductors 17, 18. The first and second conductors 17,18 may also be referred to as the "load conductors". Respective first terminals 171, 181 and second terminals 174, 184 of the first and second conductors 17, 18 extend through the meter base 14. It should be noted that the first terminal 181 of the second conductor 18 is not visible in FIG. 2. The respective first terminals 171, 181 of the conductors 17, 18 may be electrically coupled with a "2S" three wire format, 240 volt (120V) root-mean-square (RMS) 60 hertz (60 Hz) single phase centre tapped mains supply as commonly used in the USA for residential premises, from which a current of 0 A to 200 A RMS may be drawn. Respective second terminals 174, 184 of the first and second conductors 17,18 may be electrically coupled to a residential premises. Current flows in an opposite direction in each of the conductors 17,18.

The first sensor component 20 is located adjacent, or next to, the first conductor 17. Specifically, the first sensor component 20 is provided adjacent a circulation part 177 (not visible on FIG. 2) of the first conductor 17. The first sensor component 20 is mechanically secured relative to the circulation part 177 of the first conductor 17 by the first connection arrangement 23. The first sensor component 20 is positioned and configured such that, when an alternating current flows through the first conductor 17, the time-varying magnetic field resulting from the alternating current causes an electromotive force (EMF) to be induced in the first sensor component 20. The second sensor component 22 is located adjacent to the second conductor 18. Specifically, the second sensor component 22 is provided adjacent a circulation part 187 (not visible in FIG. 2) of the second conductor 18. The second sensor component 22 is mechanically secured relative to the circulation part 187 of the second conductor 18 by the second connection arrangement 24. The second sensor component 22 is positioned and configured such that, when an alternating current flows through the second conductor 17, the time-varying magnetic field resulting from the alternating current causes an electromotive force (EMF) to be induced in the second sensor component 22.

In this example, the first and second sensor components 20, 22 are located adjacent the same face of their respective conductors 17, 18. When viewed from the perspective of FIG. 2, the sensor components 20, 22 are both positioned adjacent the front face of their respective conductor 17, 18. In other examples, the sensor components may be located adjacent, different faces of their respective conductors. The first and second sensor components 20, 22 are substantially identical.

Figure 3:
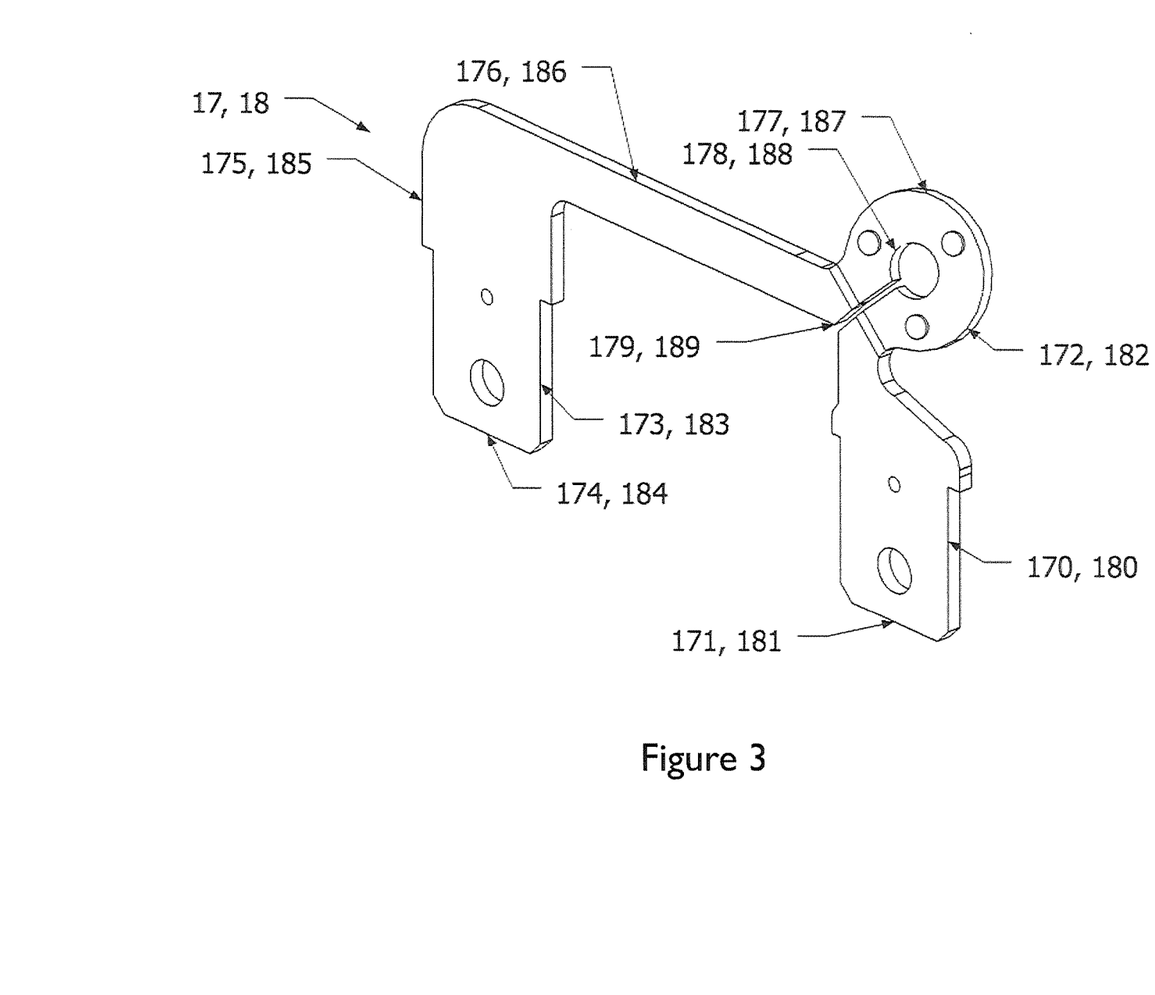
FIG. 3 is a isometric view of a conductor that may form part of the electricity meter of FIGS. 1 and 2.

FIG. 3 is an isometric view of either one of the first and second conductors 17, 18 in accordance with various embodiments of the invention.

The conductor 17, 18 is generally U-shaped and comprises a first limb 170, 180, a second limb 173, 183 and third limb 176, 186. The limbs 170, 180, 173, 183, 176, 186 may also be referred to as conduction components. The distal end of the first limb 170, 180 is hereafter referred to as the first terminal 171, 181. The distal end of the second limb 173, 183 is hereafter referred to the second terminal 174, 184. The first limb 170, 180 extends from the first terminal 171, 181 to a first corner region 172, 182 of the conductor 17, 18. The second limb 173, 183 extends from the second terminal 174, 184 to a second corner region 175, 185 of the conductor 17, 18. The third limb 176, 186 connects the first corner region 172, 182 and the second corner region 175, 185.

The conductor 17, 18 also comprises a circulation part 177, 187 formed at the first corner region 172, 182. The perimeter of the circulation part 177, 187 is substantially circular. The circulation part 177, 187 has a hole 178, 188 formed at its geometric centre. Consequently, the circulation part 177, 187 is substantially annular. The circulation part also comprises an elongate aperture 179, 189 slot extending from the hole 178, 188 to an edge of the conductor that lies between the first limb 170, 180 and the third limb 176, 186. As such, the only significant electrical path between the first limb 170, 180 and the third limb 176, 186 includes the circulation part 177, 187. Consequently, when current flows through the conductor 17, 18 it is caused to circulate (or flow in a substantially circular path) as it travels around the circulation part 177, 187. As such, a suitably shaped magnetic field is generated that can be detected by the sensor component 20, 22 provided adjacent the circulation part 177, 187.

Each of the limbs 170, 180, 173, 183, 176, 186 and the circulation part 177, 187 is generally planar and is comprised of a conducting material. The conducting material may be copper. In this example, the limbs 170, 180, 173, 183, 176, 186 and the circulation part 177, 187 lie in the same plane. However in other examples, the limbs 170, 180, 173, 183, 176, 186 and the circulation part 177, 187 may lie in different planes, for example as a result of one or more bends provided between the limbs and the circulation part.

The direction of extension of the first limb 170, 180 from the first terminal 171,181 to the first corner region 172, 182 is substantially parallel to the direction of extension of the second limb from the second terminal 174, 184 to the second corner region 175, 185. The direction of extension of the third limb 176, 186 from the first corner region 172, 182 to the second corner region 175, 185 is substantially perpendicular to the directions of extension of the first and second limbs 170, 180, 173, 183. The angle between the direction of extension of the first limb 170, 180 and a direction of extension of the insulating slot 179, 189 from the hole 178, 188 is approximately 135 degrees. The angle between the direction of extension of the third limb 176, 186 and a direction of extension of the insulating slot 179, 189 from the hole 178, 188 is approximately 45 degrees.

Figure 4:
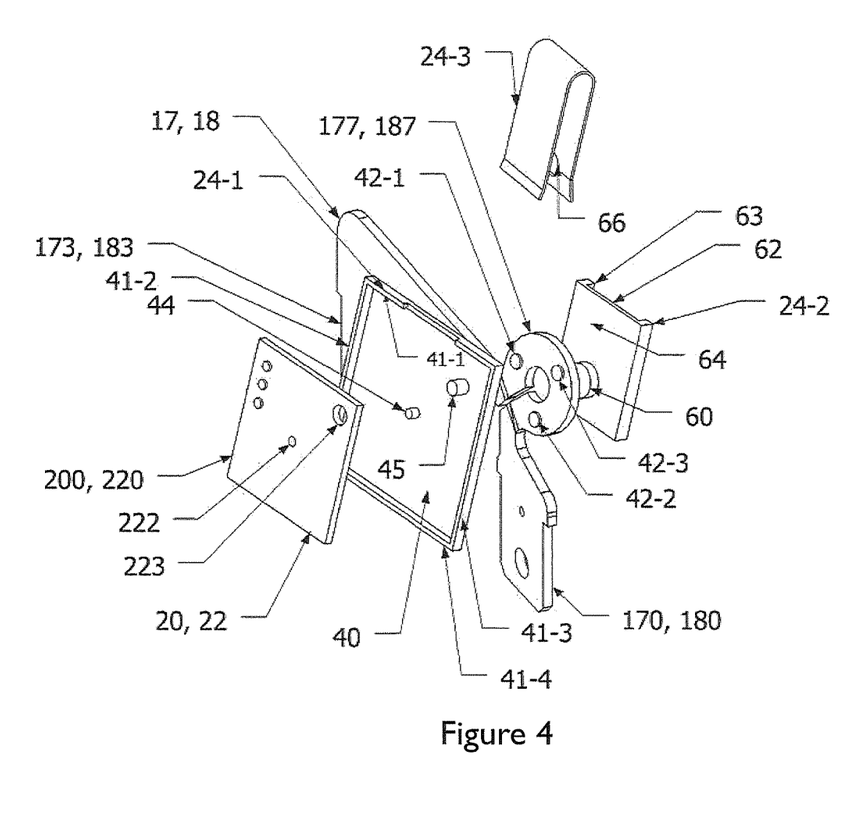
FIG. 4 is an exploded view of the conductor of FIG. 3 with an arrangement for affixing the sensor component to the conductor.

FIG. 4 is an exploded view of either of first and second conductors 17, 18 with an example of the connection arrangement 23, 24 for affixing the sensor component 20, 22 to the conductor 17, 18. Each of the connections arrangements 23, 24 for mechanically securing the sensor components 20, 22 to their respective conductor 17, 18 may be substantially identical.

The first and second sensor components 20, 22, which may be referred to as coil arrangements, each comprise a main conductive path (not shown in the Figures) provided on a surface of a main substrate portion 200, 220. The main substrate portions 200, 220 are planar and may comprise printed circuit board. The plane in which the main conductive path of each coil arrangement 20, 22 lies is substantially parallel to a plane in which the circulating part 177, 187 of the adjacent conductor 17, 18 lies.

Each of the connection arrangement 23, 24 comprise an insulating carrier 24-1 configured to carry the sensor component 20, 22. The insulating carrier 24-1 is of a material that is suitable to electrically insulate sensor component 20, 22 from the conductor 20, 22. The insulating carrier 24-1 comprises a base surface 40 which, when the connection arrangement 24 is in situ, is located adjacent the planar surface of the circulation part 177, 187 of the conductor 17, 18. When the sensor component 20, 22 is carried in the carrier 24-1, the sensor component 20, 22 and the base surface 40 of the carrier 24-1 are substantially parallel.

The insulating carrier 24 may be formed from any electrically insulating material. Ideally, the insulating carrier is formed of a mouldable, electrically insulating material such as, but not limited to, a liquid crystal polymer, for example Vectran.

The base surface 40 of the carrier 24-1 is spaced from the planar surface of the conductor (specifically, the circulation part of the conductor) by at least three spacing elements 42-1, 42-2, 42-3. The spacing elements 42-1, 42-2, 42-3 may be said to form a "three-point mount" for the sensor component 20, 22. The spacing elements 42-1, 42-2, 42-3 are included so as to maintain, as far as is possible, a constant separation between the sensor component 20, 22 and the planar surface of the conductor 17, 18 even as external forces (for example, resulting from slightly misaligned infrastructure into which the electricity meter is installed) cause the first and/or second limbs and so also the circulation part 177, 187 of the conductor to flex or bend. The spacing elements 42-1, 42-2, 42-3 utilise similar principles to so-called "kinematic mounts" to maintain the constant separation, or spacing.

The spacing elements 42-1, 42-2, 42-3 may be of any suitable shape including, but not limited to, domes (or hemispheres), truncated cones and truncated pyramids. In general terms, the width of each spacing element 42-1, 42-2, 42-3 may reduce as the element extends from its base. Preferably, the spacing elements 42-1, 42-2, 42-3 are hemispherical as this serves to spread the contact force between the spacing elements 42-1, 42-2, 42-3 and the carrier 24-1.

In the specific example of FIG. 4, the spacing elements 42-1, 42-2, 42-3 project from, and are affixed to, the planar surface of the circulation part 177, 187 of the conductor 17, 18. Also in this example, they are equally spaced around the circulation part 177, 187 of the conductor 17, 18. The spacing elements may be formed on the conductor by pressing. However, it will of course be appreciated that other techniques, for example machining and stamping, may instead be used.

In other examples, not shown in the Figures, the spacing elements may instead be provided on the carrier 42-1 for the sensor component 20, 22. Put another way, they may extend from and be affixed to the carrier 42-1, specifically its base surface 40, thereby to space the carrier 42 from the circulation part 177, 187 and to maintain separation between the sensor component 20, 22 and the planar surface of the conductor 17, 18.

In general terms, when the connection arrangement is in situ on the conductor, each of the spacing elements 42-1, 42-2, 42-3 is affixed at its base to either of the planar surface of the conductor 17, 18 or the base surface 40 of the carrier 24-1 and is in contact at its upper end with the other one of the planar surface of the conductor 17, 18 and the base surface 40 of the carrier 24-1.

The spacing elements 42-1, 42-2, 42-3 are arranged in a two-dimensional arrangement. The spacing elements 42-1, 42-2, 42-3 may be equidistantly spaced from one another (as they are in FIG. 4). Put another way, where there are three spacing elements 42-1, 42-2, 42-3, they may form an equilateral triangle.

Each of the spacing elements 42-1, 42-2, 42-3, which may be referred to as "upstands", is of substantially the same height. As such, a plane coinciding with the upper end of each spacing element 42-1, 42-2, 42-3 is substantially parallel to the plane of the part of the conductor 17, 18, or the carrier 24-1, from which the elements extend.

Maintaining an optimum separation between the planar surface of the sensor component 20, 22 and the planar surface of the conductor 17, 18 is particularly important because a 0.1 millimeter change in the separation can lead to a 3.5% decrease in the sensitivity of the sensor component 20, 22 to current flowing in the conductor 17, 18. The 3.5% decrease in sensitivity is calculated based on a sensor component that is 30 mm by 30 mm.

In one realised example, the spacing elements 42-1, 42-2, 42-3 may separate the planar surface of the conductor 17, 18 from the base surface 40 of the carrier 24-1 by 0.2 millimeters. Put another way, the height of each spacing element 42-1, 42-2, 42-3 may be 0.2 mm. In this realised example, the depth of material of the conductor 17, 18 is 2 mm.

As mentioned above, the plane of the circulation part 177, 187 may be at an angle to the plane of the first and second limbs 170, 180, 173, 183. The circulation part 177, 187 may be at an angle of, for example, between 1 and 90 degrees to the plane of the first and second limbs 170, 180, 173, 183. Preferably, the angle is approximately 5 degrees. The presence of an angle between the planes of the circulation part 177, 187 and the first and second limbs 170, 180, 173, 183 may enable the height of the spacing elements 42-1, 42-2, 42-3 to be less than might otherwise be required. This is because angling the circulation part 177, 187 relative to the limbs prevents the corners of the carrier 24-1 from touching the conductor 17, 18 when the conductor 17, 18 becomes twisted. As will be appreciated, the kinematic mount provided by the spacing elements 42-1, 42-2, 42-3 may become less effective if the carrier 24-1 touched the surface of the conductor 17, 18.

In some examples, more than three spacing elements 42 may be utilised. However, this arrangement may be less effective for maintaining a constant separation between the sensor component 20, 22 and the planar surface of the conductor 17, 18.

The insulating carrier 24-1 of the connection arrangement 24 further comprises a plurality of wall portions 41-1, 41-2, 41-3, 41-4 projecting from the edges of the base surface 40. The wall portions 41-1, 41-2, 41-3, 41-4 extend in a direction that is substantially perpendicular to the base surface. The direction of extension of the wall portions 41-1, 41-2, 41-3, 41-4 is substantially away from the conductor 17, 18, when the carrier is affixed to the conductor. The base surface 40 and wall portions 41-1, 41-2, 41-3, 41-4 are configured so as to restrict movement of the sensor component 20, 22 in the plane that is parallel to the base surface 40 of the carrier 24-1. In the example shown in the Figures, the base surface is substantially the same shape and size as the sensor component 20, 22. The wall portions 41-1, 41-2, 41-3, 41-4 surround the sensor component around its entire perimeter. However, it will be appreciated that this may not be the case and that it may be sufficient for each of the wall portions 41-1, 41-2, 41-3, 41-4 to project from only part of the length of its respective edge of the base surface 40.

The carrier 24-1 comprises a first projection 44 extending from a central region of the base surface 40 in a direction away from the conductor. The first projection 44 is configured to engage (or mate with) a first aperture 222 formed in the sensor component 20, 22. In this example, the aperture 222 is formed in a central region of the sensor component 22. The projection 44 and corresponding aperture 222 prevent translation of the sensor component relative to the carrier 24-1. In this example, the carrier comprises a second projection 45 configured to engage a second aperture 223 formed in the sensor component 22. Although not clear from the figures, the second aperture 223 is located outside the perimeter of the conductive track of the sensor component 20, 22.

Figure 5:
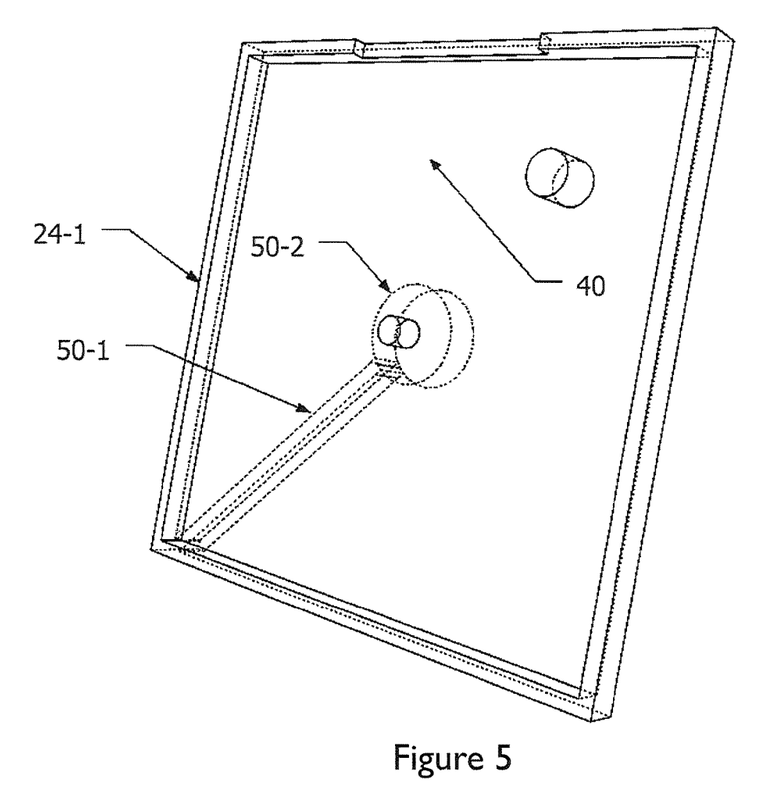
FIG. 5 is a view of a reverse side of the carrier for the sensor component which forms part of the arrangement of FIG. 4.

FIG. 5 is a view of the carrier 24-1 shown in FIG. 4. Extending from the base surface 40 of the carrier 24-1 in an opposite direction to the first projection 44 is a projecting arrangement 50 configured to engage the elongate aperture 179, 189 formed in the conductor 17, 18. As the projecting arrangement projects from the reverse side of the carrier 24-1 to that shown in the Figure, it is depicted using broken lines. The projecting arrangement 50 comprises a first part 50-1 which is configured to engage the elongate aperture 179, 189 in addition to a second part 50-2 which does not engage the elongate aperture 179, 189. Together the first and second parts restrict or prevent translation of the carrier 24-1 parallel to the plane of the circulation part 177, 187 of the conductor 17, 18. Although the sensitivity of the sensor component 20, 22 may not be affected as significantly by translation parallel to the plane of the circulation part 177, 187 as it is by movement perpendicular to the plane of the circulation part 177, 187, it is nonetheless beneficial to the sensitivity of the sensor component 20, 22 to restrict this movement.

The second part 50-2 of the projection arrangement 50 is configured to substantially prevent translation of the carrier in the direction of extension of the elongate aperture 179, 189 as it extends from the central region of the circulation part 177, 187. In this specific example, this is achieved by the second part 50-2 engaging the hole 178, 188 in the central region of the circulation part 177, 187 which has a diameter that is greater than the width of the elongate aperture 179, 189. In other examples, however, this may be achieved in a different way. For example, the first and second parts may be separate and the second part may engage an outer edge of the circulation part at a point that is generally opposite the location at which the elongate aperture 179, 189 coincides with the edge of the circulation part 177, 187.

Figure 6:
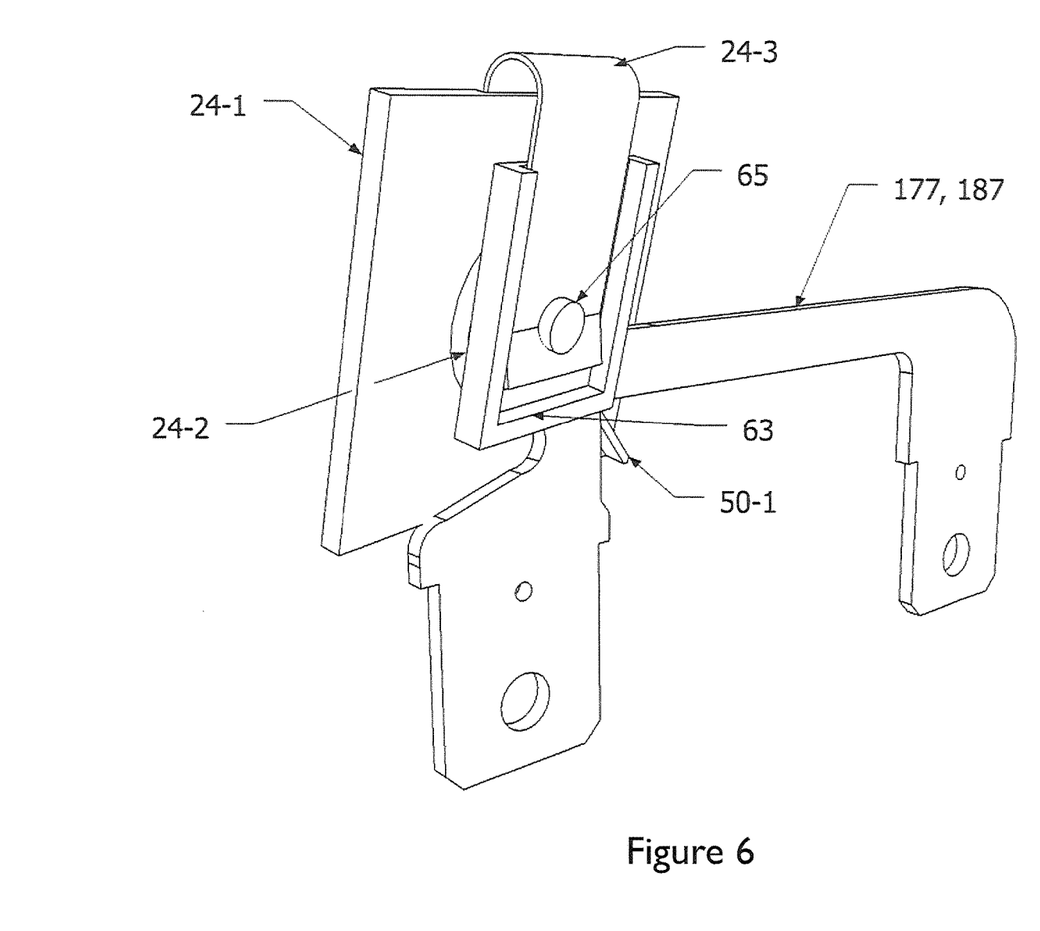
FIG. 6 is a view of the sensor component affixed to the conductor via the arrangement of FIG. 4.

Returning now to FIG. 4 and also considering FIG. 6, which shows the connection arrangement 24 in place on the conductor 17, 18, the connection arrangement 24 further comprises biasing means 24-3 configured to urge the sensor component 20, 22 towards the conductor 17, 18. In this example, the biasing means 24-3 is in the form of a spring clip.

The connection arrangement 24 further includes an intermediate element 24-2 configured to engage the conductor and the biasing means 24-3. The intermediate element 24-2 includes, on a first side, a projection 60 configured to engage the hole 178, 188 formed in the circulation part 177, 187. This restricts movement of the intermediate element relative to the conductor. Provided on a second opposite side of the intermediate element 24-2 is a recess 62 for receiving part of the biasing means 24-3 thereby to restrict movement of the biasing means 24-3 relative to the intermediate element 24-2. In this example, the recess 62 is formed by wall portions 63 extending from a base surface 64 of the intermediate element 24-2. The wall portions 63 extend in an opposite direction to the direction of extension of the projection 60 for engaging the conductor 17, 18.

The intermediate element 24-2 comprises a second projection 65 for engaging an aperture 66 formed in the biasing means 24-3. The second projection 65 extends away from the conductor 17, 18 when the intermediate element 24-2 is in situ. The second projection 65 restricts relative movement of the intermediate element 24-2 and the biasing means 24-3. Specifically, the projection 65 prevents movement of the biasing means 24-3 in a direction towards an open end of the recess 62 of the intermediate element 24-2.

The intermediate element 24-2 comprises an electrically insulating material, which may be the same type of material from which the carrier 24-1 is formed. This is particularly important when the biasing means is formed of an electrically conducting material, such as steel. In some examples, the biasing means 24-3 may be comprised of an insulting material and, in such examples, the intermediate element 24-2 may be omitted from the connection arrangement 24. The biasing means 24-3 may, however, include a projection arrangement for engaging conductor 17, 18 (for example, the hole 178, 188 of the circulation part 177, 187) to restrict movement of the biasing means 24-3 relative to the conductor 17, 18.

Although not visible in the figures, when the connection arrangement 24 is in situ, the biasing means 24-3 is urged against the rear face of the sensor component 20, 22 (i.e. that which faces away from the conductor 17, 18). In some examples, the main conductive paths of the sensor components 20, 22 are provided on both surfaces of their main substrate portion 200, 220 and are connected by a via formed through the main substrate portion 200, 220. In such examples, a layer of insulating material may be provided adjacent the side of the sensor component 20, 22 is engaged by the biasing means 24-3. This may be in the form of an additional intermediate element, which may be similar to that described above.

An alternative embodiment, with a different attachment arrangement, will now be described with reference to FIGS. 7 and 8. In this embodiment, reference numerals are retained from the earlier Figures for like elements.

Figure 7:
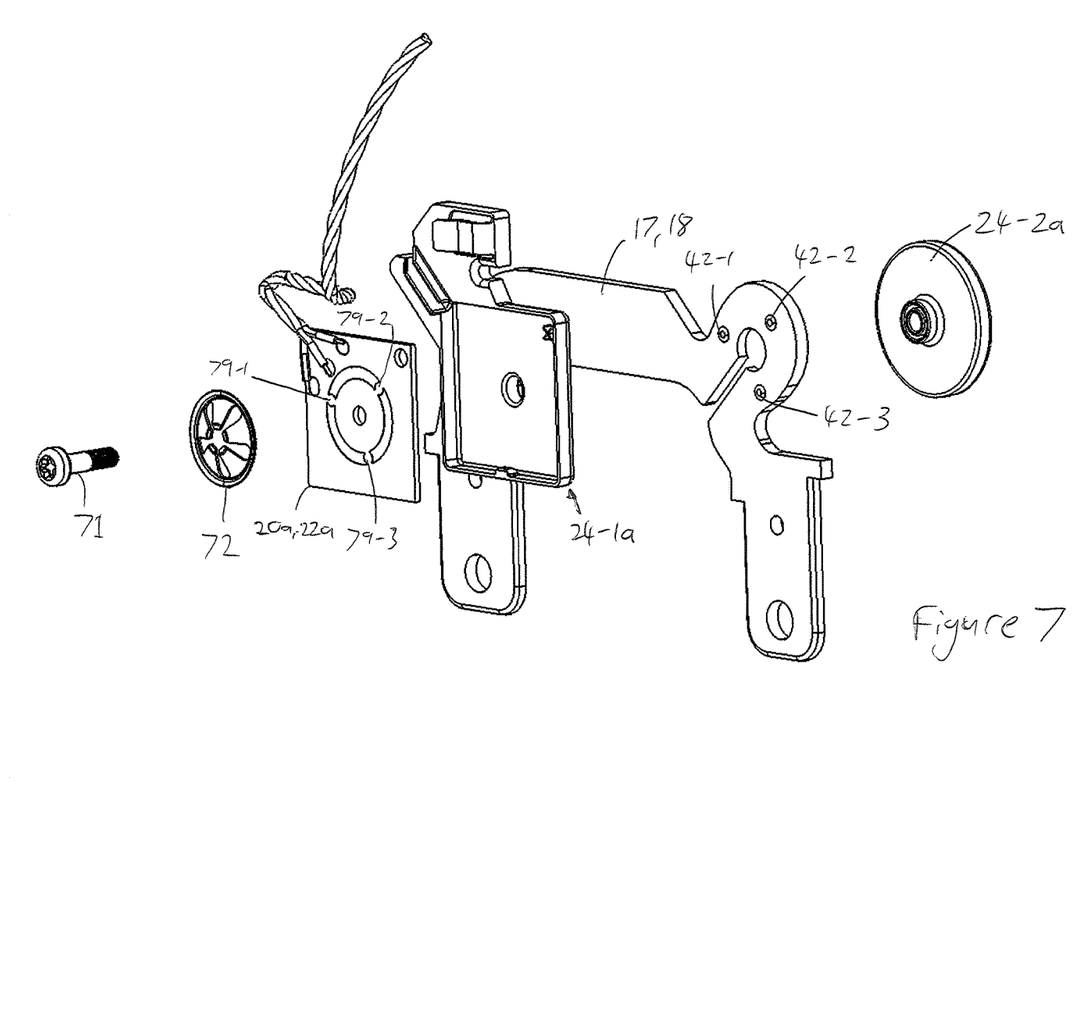
FIG. 7 is an exploded view of the conductor of FIG. 3 with an alternative arrangement for affixing the sensor component to the conductor.
Figure 8:
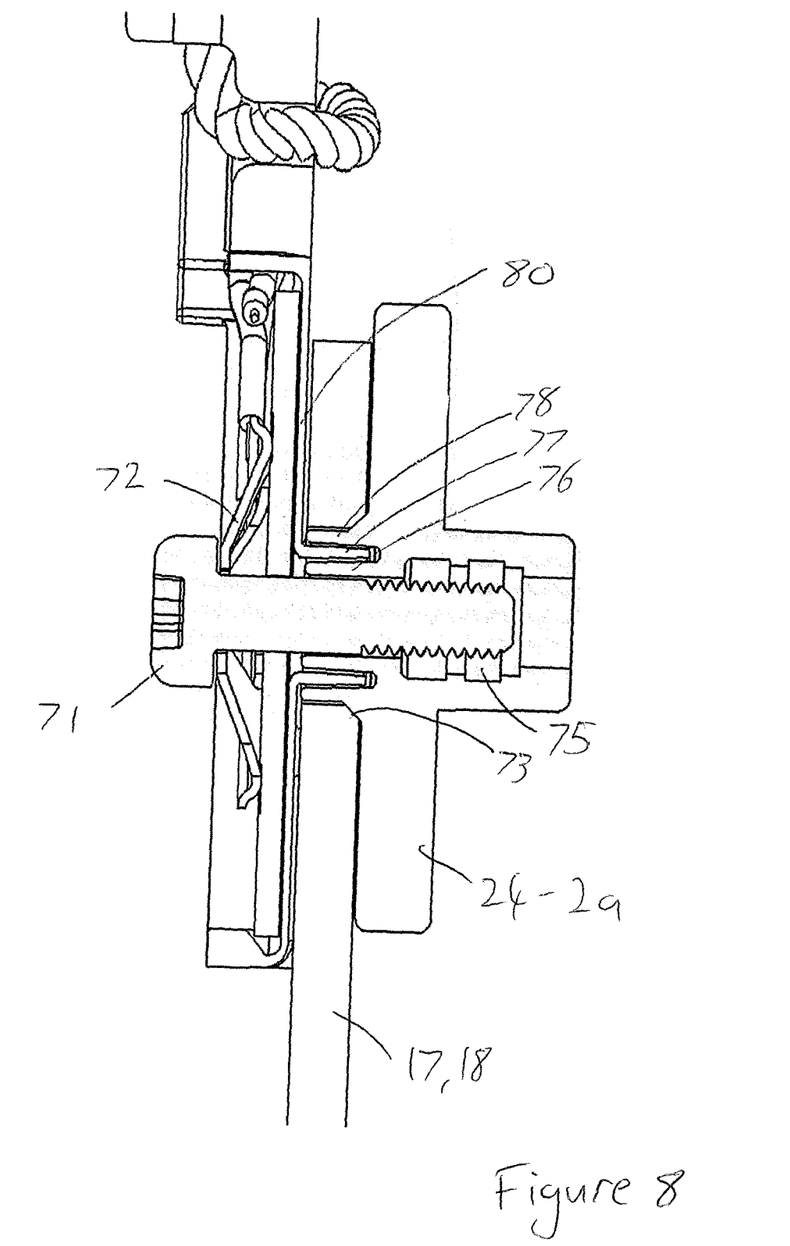
FIG. 8 is a side cross-sectional view of the alternative arrangement of FIG. 7.

Some of the components of the FIGS. 7 and 8 embodiments are identical to the Figures of the earlier embodiments. In particular, the conductor 17, 18 is identical to the conductor 17, 18 shown in FIG. 3. Additionally, the sensor components 20a, 22a are the same as the sensor components 20, 22 shown in FIG. 4, except as described below. Additionally, for the most part the insulating carrier 24-1a is the same as the insulating carrier 24-1 of FIG. 4, except as described below.

In the embodiment of FIGS. 7 and 8, a bolt 71 is arranged to extend through a central aperture in a spring washer 72, through an aperture in the substrate portion 200, 220 of the sensor components 20a, 22a, through an aperture formed in the centre of the insulating carrier 24-1a, through the aperture 178, 188 in the conductors 17, 18 and into a rear insulating washer 24-2a, which may be termed a rear insulator. The rear insulator 24-2a contains a comoulded nut 25, which receives an external thread on the bolt 71. This is best seen in FIG. 8.

Also as best seen in FIG. 8, the rear insulator 24-2a includes first and second annular concentric elements 76, 78, which are arranged axially with respect to the nut 75. The innermost one of the annular concentric elements 76 has an internal diameter that is approximately the same as or slightly larger than the external diameter of the bolt 71. A gap between the concentric elements 76 and 78 of the rear insulator 24-2a receives an annular element 77 that extends from the rear surface of the carrier 24-1a to become concentric with the annular concentric elements 76, 78. The annular concentric elements 76, 77, 78 fit relatively tightly together and limit movement of the insulating carrier 24-1a and the rear insulator 24-2a. The outermost diameter of the outer concentric element 78 of the rear insulator 24-2a is approximately the same as or slightly smaller then the internal diameter of the aperture 178, 188 in the conductor 17, 18. The rear insulator 24-2a locates via a chamfer 73 onto a matching chamfer that is provided on the aperture 178, 188 in the conductor 17, 18.

Apart from the absence of the protrusion 44 and the presence of the aperture, the insulating carrier 24-1a of FIGS. 7 and 8 is the same as the insulating carrier 24-1 of FIGS. 4 and 5.

To assemble the arrangement from the components shown in FIG. 7 to the assembled view shown in cross section in FIG. 8, the bolt 71 is tightened into the nut 75 of the rear insulator 24-2a. This causes partial compression of the spring washer 72 onto the PCB 20, 22 of the sensor component 20, 22. The bolt 71 is retained in place by a locking compound in the thread of the nut 75, or through some other means.

The spring washer maintains a positive force holding the sensor 20, 22 against the spacing elements 42-1, 42-2 and 42-3 via the insulating carrier 24-1a on the conductor 17, 18. Because of the configuration of the arrangement, the spring washer 72 maintains positive force against the spacing elements 42-1, 42-2 and 42-3 over many cycles of thermal expansion and contraction, including any creep of the insulating parts 24-2a and 24-1a, and over many cycles of mechanical flexing of the conductor 17, 18. With the use of a spring washer 72 with a compression of around 1 mm, partial compression of the spring washer 72 to about half of the total compression (i.e. around 0.5 mm) typically provides a retaining force of around 5 to 15 Newtons.

A solder resist layer on the sensor 20, 22 is removed over the contact area of the spring washer 72 apart from three patches 79-1, 79-2 and 79-3 that match the positions of the spacing elements 42-1, 42-2 and 42-3 on the conductor 17, 18. This results in minimisation of warping of the sensor 20, 22 if the contact area of the spring washer 72 on the sensor board 20, 22 is not perfectly flat.

The shank (external diameter) of the bolt 71 is a close fit within the central aperture of the sensor 20, 22. Furthermore, it is a close fit with the central aperture of the rear insulator 24-2a. These features provide good lateral positioning of the sensor 20, 22 relative to the conductor 17, 18, in corporation with the chamfers 73 at the rear of the conductor 17, 18 and on the rear insulator 24-2a.

By virtue of the configuration as shown in FIGS. 7 and 8, the only plastic creepage that might effect the sensor calibration is the thickness of the carrier 24-1a that is sandwiched between the sensor 20, 22 and the mounts 42, together with any compression in the sensor 20, 22 itself at the same point. This plastic creepage is minimised by the use of a thermally stable polymer (e.g. a glass loaded polymer such as Vectra or Stanol) which allows the thickness of a sheet-like part 80 of the carrier 24-1a to be relatively thin yet with effective electrical stand off. It also ensures that the mounting forces are directed straight through the spacing element 42-1, 42-2 and 42-3 from the contact points of the spring washer 72 (the contact points are formed around a circle of the outer edge of the spring washer 72) through the raised elements of the sensor 79-1, 79-2, 79-3 through the sheet-like part 80 of the carrier 24-1a onto the spacing elements 42-1, 42-2, 42-3.

The overlapping concentric elements 76, 77 and 78 of the insulators 24-1a and 24-2a maintain a suitable electrical creepage distance from the bus bar 170 to the bolt 71. The sidewalls 79 of the carrier 24-1a provide a suitable electrical creepage distance between the sensor 20, 22 and the conductor 17, 18.

In alternative embodiment, the bolt 71 and nut 75 are replaced with a rivet that extends through the spring washer 72, the insulating carriers 24-1a and the rear washer 24-2a. In this embodiment, the rivet is assembled to a set length, which is chosen so as to leave the spring washers 72 partially compressed and thereby providing the required amount of force to the sensor 20, 22.

In some examples, electrostatic shields (not shown in the Figures) may be also provided between the conductors 17, 18 and their respective coil arrangements 20, 22 so as to reduce capacitive coupling of mains-borne interference (or of the AC mains voltage potential) from the conductors 17, 18 to the coil arrangements 20, 22.

Although the above described specification describes a number of specific angular relationships it will be appreciated that a margin of acceptable variance (for example, 10 degrees) may be associated with these angular relationships. As such, when two planes, directions or axes are said to be "perpendicular", this may include the planes, axes or directions being at any angle to one another that is between 80 and 100 degrees. Similarly, when two planes, directions or axes are said to be "parallel", this may include the planes, axes or directions being at any angle to one another that is between 10 and 350 degrees.

It should be realized that the foregoing embodiments should not be construed as limiting. Other variations and modifications will be apparent to persons skilled in the art upon reading the present application. For example, although not shown in the figures, it will be appreciated that the insulating carrier may be formed of the substrate material on which the sensor component, in the form of the conductive track, is provided. For example, the substrate may be a multilayer PCB with the conductive track sandwiched between two layers. The substrate may be configured also to include the projection arrangement for engaging the conductor and preventing translation of the sensor component relative to the conductor. The substrate may additionally include the at least three spacing elements for maintaining the constant separation between the sensor component (which is, in this embodiment, the conductive track) and the conductor. In other examples, some of the spacing elements 42-1, 42-2, 42-3 may be extend from the conductor 17, 18 while others extend from the carrier 24-1.

Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

The invention claimed is:

1. An electricity meter comprising:
    a conductor comprising a circulation part having a substantially planar surface, the circulation part causing current flowing therein to travel a substantially circular path;
    a sensor component for enabling detection of current flowing in the conductor; and
    a connection arrangement configured to mechanically secure the sensor component relative to the circulation part and to urge the sensor component towards the substantially planar surface of the circulation part, the connection arrangement comprising an insulating carrier for carrying the sensor component, the insulating carrier being positioned adjacent to the substantially planar surface of the circulation part,
    wherein the insulating carrier is spaced from the substantially planar surface of the circulation part by an arrangement of at least three spacing elements located between the insulating carrier and the substantially planar surface of the circulation part, the connection arrangement and the at least three spacing elements being configured to maintain a constant separation between the insulating carrier and the circulation part at locations of the at least three spacing elements in an event of flexing of the conductor.

2. The electricity meter of claim 1, wherein the at least three spacing elements project from the substantially planar surface of the circulation part.

3. The electricity meter of claim 1, wherein the sensor component comprises a conductive track provided on a printed circuit board.

4. The electricity meter of claim 1, wherein the insulating carrier comprises a printed circuit board having the sensor component provided thereon.

5. The electricity meter of claim 1, wherein the circulation part comprises an elongate aperture extending from a central region of the circulation part to an edge of the circulation part, and wherein the insulating carrier comprises a projecting arrangement configured to engage the elongate aperture thereby to restrict movement of the insulating carrier relative to the conductor.

6. The electricity meter of claim 1, wherein the circulation part comprises a hole in an inner region thereof, and wherein the insulating carrier comprises a projecting arrangement configured to engage the hole.

7. The electricity meter of claim 6, wherein the circulation part comprises a hole in an inner region thereof, the projecting arrangement being configured to engage the hole, wherein an elongate aperture extends from the hole to an edge of the circulation part, and wherein the projecting arrangement comprises a first part having a shape corresponding to that of the hole and a second part having a shape corresponding to that of the elongate aperture.

8. The electricity meter of claim 7, wherein the insulating carrier includes at least one projecting element projecting in an opposite direction to the at least one projecting arrangement, the at least one projecting element configured to engage at least one aperture formed in the sensor component.

9. A method of manufacturing an electricity meter, comprising:
    providing a conductor comprising a circulation part having a substantially planar surface the circulation part causing current flowing therein to travel a substantially circular path;
    providing a sensor component for enabling detection of current flowing in the conductor;
    providing a connection arrangement configured to mechanically secure the sensor component relative to the circulation part and to urge the sensor component towards the substantially planar surface of the circulation part, the connection arrangement comprising an insulating carrier for carrying the sensor component; and
    positioning the insulating carrier adjacent to the substantially planar surface of the circulation part such that the insulating carrier is spaced from the substantially planar surface of the circulation part by an arrangement of at least three spacing elements located between the insulating carrier and the substantially planar surface of the circulation part, the connection arrangement and the at least three spacing elements being configured to maintain a constant separation between the insulating carrier and the circulation part at locations of the at least three spacing elements in an event of flexing of the conductor.

10. The electricity meter of claim 1, wherein the at least three spacing elements are part of the conductor.

11. The electricity meter of claim 1 wherein an optimum separation between a substantially planar surface of the sensor component carried by the insulating carrier and the substantially planar surface of the circulation part of the conductor is maintained so as to avoid any decrease in sensitivity of the sensor component to current flowing in the conductor in the event of flexing of the conductor.

12. The electricity meter of claim 1, wherein the at least three spacing elements are equally spaced around the circulation part.

13. The electricity meter of claim 1, wherein the connection arrangement is configured to maintain a positive force for holding the sensor component against the at least three spacing elements via the insulating carrier, thereby to urge the sensor component towards the conductor.

14. The electricity meter of claim 13, wherein the connection arrangement comprises a spring washer that is configured to maintain the positive force for holding the sensor component.

15. The electricity meter of claim 14, wherein the sensor component comprises a conductive track provided on a printed circuit board and the spring washer is in contact with the printed circuit board, and wherein a solder resist layer of the printed circuit board has been removed over an area of contact between the spring washer and the printed circuit board apart from three patches that correspond with positions of the at least three spacing elements.

16. The electricity meter of claim 1, wherein the connection arrangement comprises a spring clip configured to urge the sensor component towards the conductor.

17. The method of claim 9, comprising providing one of a spring washer and a spring clip configured to maintain a positive force for holding the sensor component against the at least three spacing elements via the insulating carrier.

18. The method of claim 17, wherein the sensor component comprises a conductive track provided on a printed circuit board, the method comprising:
   providing the spring washer; and
   removing a solder resist layer of the printed circuit board over an area of contact between the spring washer and the printed circuit board apart from three patches corresponding with positions of the at least three spacing elements.

19. The electricity meter of claim 1, wherein the circulation part of the conductor is generally planar.

20. The electricity meter of claim 1, wherein the insulating carrier comprises a base surface located adjacent to the substantially planar surface of the circulation part, and wherein the at least three spacing elements are located between the base surface and the substantially planar surface of the circulation part.

21. The electricity meter of claim 1, wherein the at least three spacing elements are provided in a triangular arrangement.

22. The electricity meter of claim 1, wherein the conductor comprises a first terminal and second terminal, wherein there is only one electrical path between the first and second terminals, and wherein the only one electrical path between the first and second terminals includes the circulation part.

* * * * *